United States Patent
Hyobu et al.

(10) Patent No.: US 7,048,127 B2
(45) Date of Patent: May 23, 2006

(54) LID UNIT FOR THIN-PLATE HOLDING CONTAINER, THIN-PLATE HOLDING CONTAINER, AND SIMPLIFIED ATTACHING/DETACHING MECHANISM

(75) Inventors: Yukihiro Hyobu, Tokyo (JP); Chiaki Matsutori, Nishigoushi-machi (JP); Tadahiro Obayashi, Yamaga (JP)

(73) Assignee: Kakizaki Manufacturing Co., Ltd., Tokyo (JP)

( * ) Notice: Subject to any disclaimer, the term of this patent is extended or adjusted under 35 U.S.C. 154(b) by 166 days.

(21) Appl. No.: 10/432,771

(22) PCT Filed: Jul. 23, 2001

(86) PCT No.: PCT/JP01/06347

§ 371 (c)(1),
(2), (4) Date: May 27, 2003

(87) PCT Pub. No.: WO03/010069

PCT Pub. Date: Feb. 6, 2003

(65) Prior Publication Data

US 2004/0020930 A1   Feb. 5, 2004

(51) Int. Cl.
 *B65D 85/48* (2006.01)
(52) U.S. Cl. .................. 206/710; 220/323; 414/217.1
(58) Field of Classification Search ............... 206/710, 206/711, 454; 220/323–326; 414/217.1, 414/806, 935
See application file for complete search history.

(56) References Cited

U.S. PATENT DOCUMENTS

| 5,711,427 | A | * | 1/1998 | Nyseth ..................... 206/710 |
| 5,915,562 | A | * | 6/1999 | Nyseth et al. .............. 206/710 |
| 5,957,292 | A | * | 9/1999 | Mikkelsen et al. ......... 206/710 |
| 6,105,782 | A | * | 8/2000 | Fujimori et al. ............ 206/710 |
| 6,491,177 | B1 | * | 12/2002 | Hyobu ...................... 206/454 |
| 6,663,148 | B1 | * | 12/2003 | Bonora et al. .............. 206/710 |

FOREIGN PATENT DOCUMENTS

| EP | 1 043 758 A2 | 5/2000 |
| JP | 2000-289795 | 10/2000 |
| JP | 2001-158499 | 6/2001 |

\* cited by examiner

Primary Examiner—Luan K. Bui
(74) Attorney, Agent, or Firm—Bacon & Thomas, PLLC

(57) ABSTRACT

The present invention provides a lid unit for closing a container body used to transport thin-plates such as semiconductor wafers or the like accommodated therein. Simplified attaching/detaching mechanisms are provided at the centers of the respective sides of the lid unit. The attaching/detaching mechanism includes a locking plate, for locking within a second recess, a lid receiving portion of the container body and a drive-out member for raising and locking the locking plate. A locking arm for fixing the drive-out member is provided on its leading side in the direction of engaging rotation. A supporting rail for guiding the raising and locking/unlocking movement of the locking plate is provided on the drive-out member. The locking plate is mounted for pivoting and sliding movement, and is provided with a holding claw for engagement within a second recess at the distal end thereof.

13 Claims, 14 Drawing Sheets

LID UNIT FOR THIN-PLATE HOLDING CONTAINER, THIN-PLATE HOLDING CONTAINER, AND SIMPLIFIED ATTACHING/DETACHING MECHANISM

TECHNICAL FIELD

The present invention relates to a lid unit for a thin-plate holding container and the thin-plate holding container, which enable a container body for accommodating thin-plates, such as semiconductor wafers, memory disks or liquid crystal glasses, for storage or transportation to be used in a manufacturing process after transportation.

BACKGROUND ART

Thin-plate holding containers for accommodating thin-plates such as semiconductor wafers or the like for storage or transportation are generally known.

Such a thin-plate holding container mainly includes a container body, and a lid unit for covering the upper opening of the container body. The container body is provided with members for supporting the thin-plates, such as semiconductor wafers or the like therein. Such a thin-plate holding container requires its interior to be kept clean during transportation in order to prevent contamination or the like on the surface of the thin-plates, such as semiconductor wafers or the like, accommodated therein. Therefore, the container is sealed. In other words, the lid unit is fixed to the container body for sealing closed the interior of the container. There are various structures for fixing the lid unit to the container body.

The plates are stored in the container body and the lid unit is fixed to the container body in a plant for manufacturing plates such as semiconductor wafers. In this state, the containers are transported to a semiconductor manufacturing plant or the like. Generally, in the semiconductor manufacturing plant, the semiconductor wafers or the like are transferred to a specifically designed container for use on a production line.

When transferring the semiconductor wafers or the like into a production line container as described above, the above-described thin-plate holding container is used only for transportation, and thus has no use after transportation. Therefore, such thin-plate holding containers, after having been emptied, are returned to the plant of origin or discarded. However, it is inefficient in terms of usage, and may result in waste of resources and increase of waste products.

Therefore, the present inventor has proposed an invention in which a lid unit receiving portion of the container body is improved so as to be capable of mating with various types of lid units, whereby the container body can also be used in the production line before (Japanese Unexamined Patent Application Publication No. 2000-289795). However, there remains a problem in that container bodies having structures different from such container body cannot be used in the production line.

In view of such circumstances, an object of the present invention is to provide a lid unit for a thin-plate holding container, in which the container body, as is, can also be used in the production line after transportation and the like.

DISCLOSURE OF THE INVENTION

A lid unit for thin-plate holding containers according to a first aspect of the invention is a lid unit for closing the container body that is transported with a plurality of thin-plates accommodated therein, having a four-sided shape and provided with a simplified attaching/detaching mechanism for the production line at the centers of opposing sides.

Since a simplified attaching/detaching mechanism for the production line is provided on the lid unit, the lid unit may be used in the production line on the container body provided for transportation. As a consequence, the container body for transportation can be used as a container body for the production line as is.

The aforementioned simplified attaching/detaching mechanism for the production line preferably includes: a locking plate for projecting into and engaging the container body; and a drive-out member for extending and raising the locking plate into a locked position.

Accordingly, the lid unit for the production line may be attached to and detached from the container body by extending and raising the locking plate through operation of the drive-out member.

A locking arm is preferably provided on the aforementioned drive-out member at a leading edge in rotation to reliably fix the drive-out member at a predetermined position at the limit of rotation.

The drive-out member is preferably guided by a rail in the extending and raising movements of the locking plate.

The locking plate is preferably supported pivotally and slidably. Accordingly, the lid unit may be reliably fixed to the container body by sliding the locking plate into the container body, and pivoting it into contact with the container body.

The aforementioned locking plate is preferably provided with a holding claw to be engaged with the container body at the distal end thereof.

DESCRIPTION OF THE PREFERRED EMBODIMENTS

Figure 1:
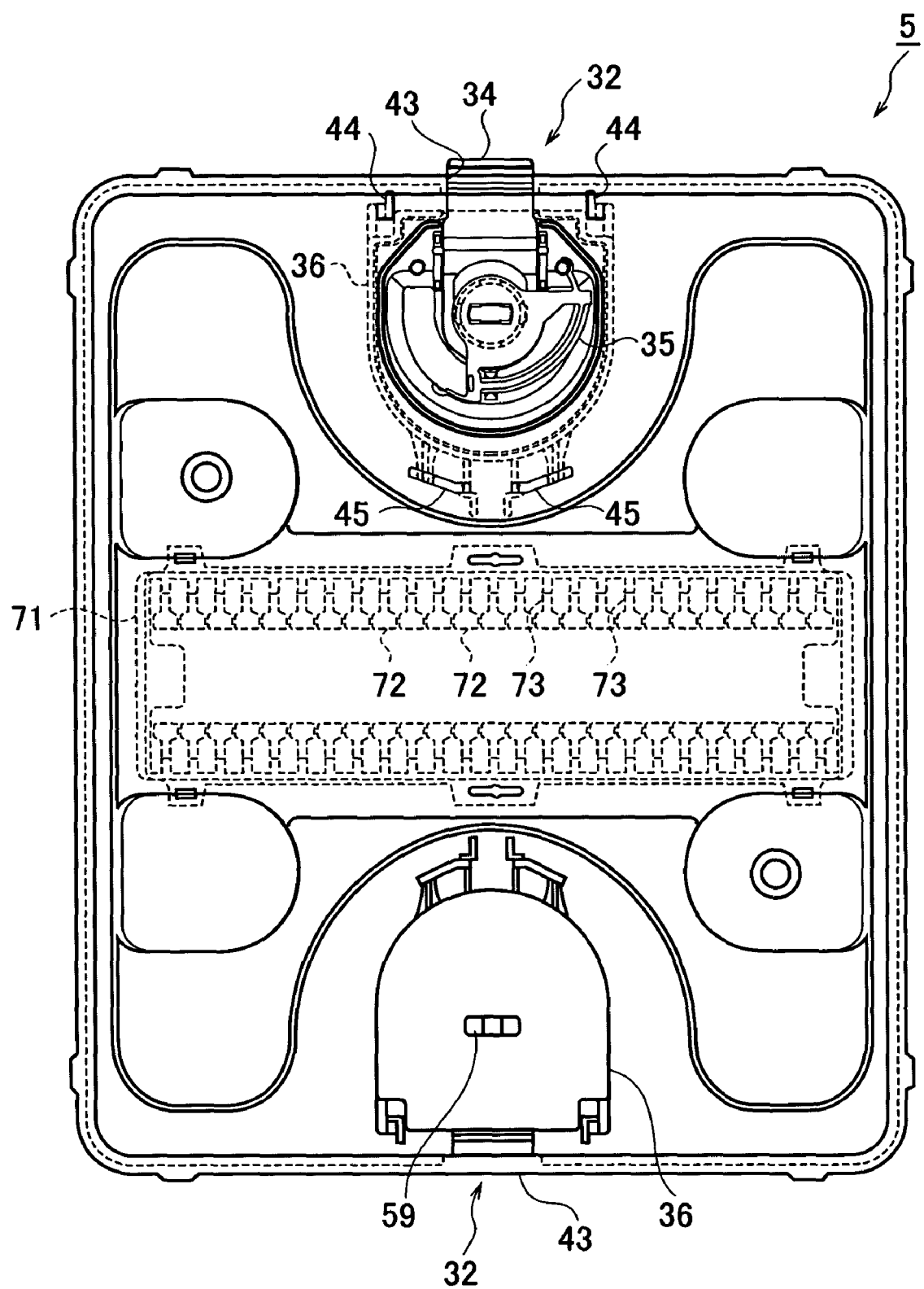
FIG. 1 is a plan view of a lid unit for a production line according to an embodiment of the present invention.

Referring now to the drawings, an embodiment of the present invention will be described. A thin-plate holding container of the present invention is designed to accommodate thin-plates such as semiconductor wafers, memory disks, liquid crystal glasses and the like for storage and transportation, and the container body may be used in the production line or the like as is after transportation. In this description, a thin-plate holding container for accommodating semiconductor wafers is taken as an example.

Figure 2:
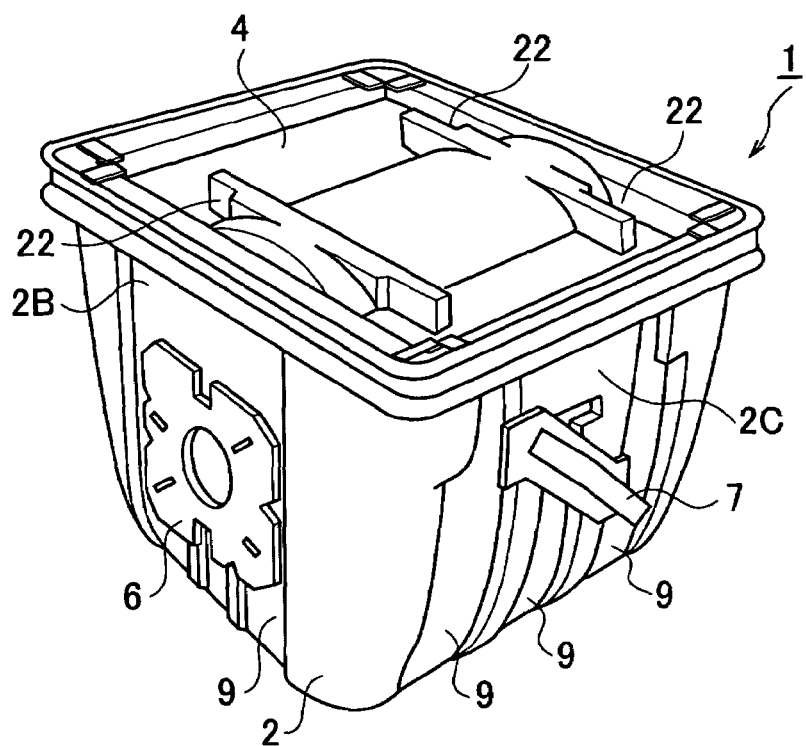
FIG. 2 is a perspective view showing a thin-plate holding container for transportation.
Figure 3:
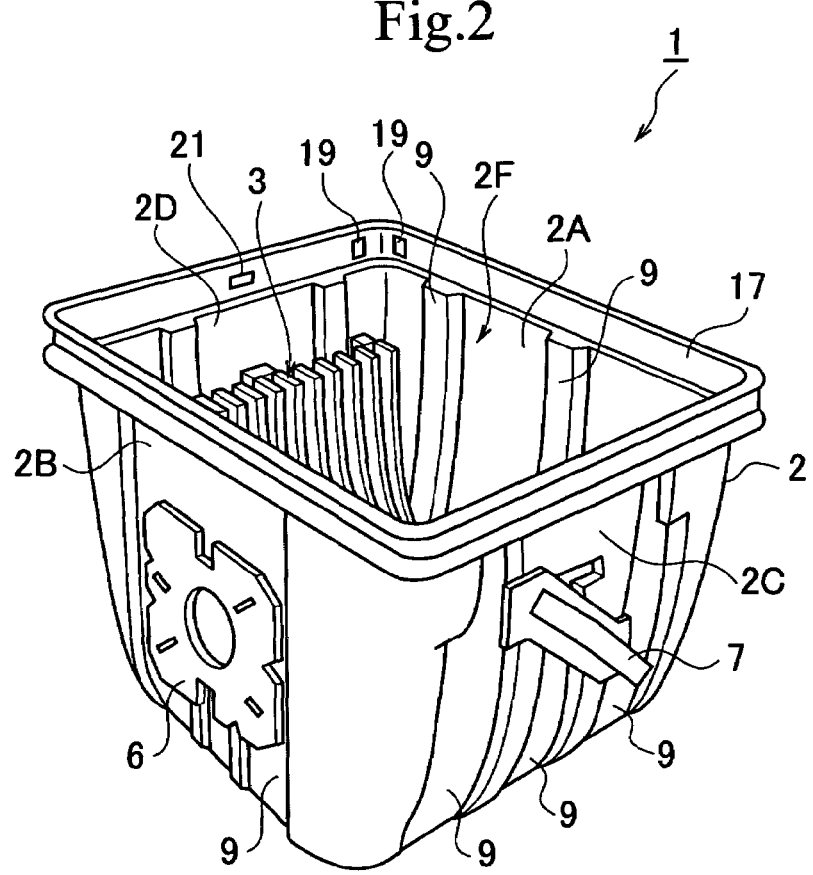
FIG. 3 is a perspective view showing a container body of the thin-plate holding container.

The thin-plate holding container 1 according to the present embodiment includes, as shown in FIGS. 1, 2 and 3, a container body 2 for accommodating a plurality of semiconductor wafers (not shown) therein, two thin-plate holding portions 3 provided on opposing side walls in the container body 2 for holding the semiconductor wafers from both sides, a lid unit 4 for transportation and a lid unit 5 for the production line for closing the container body 2, a top flange 6 to be gripped by an arm portion of a transporting device (not shown) in a plant, and a carrying handle 7 to be held by an operator when he/she carries the thin-plate holding container 1 by hand.

Figure 4:
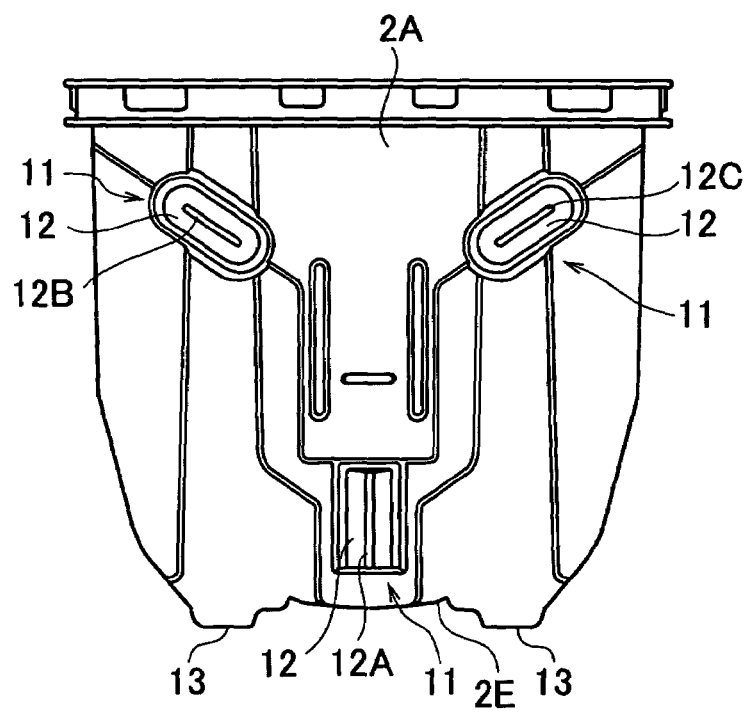
FIG. 4 is a bottom view showing the container body of the thin-plate holding container.
Figure 5:
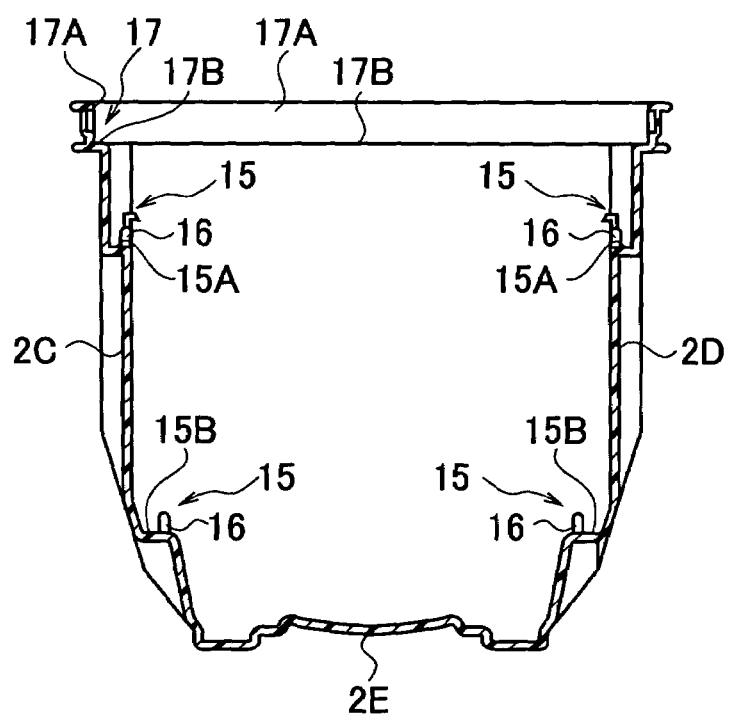
FIG. 5 is a cross-sectional view of the container body of the thin-plate holding container.

The container body 2 is generally formed into a cubic shape as shown in FIGS. 3 to 5. The container body 2, in its vertically upright position (the state shown in FIG. 3) has four sidewalls 2A,2B, 2C and 2D and a bottom plate 2E, and an opening 2F on top thereof. The respective sidewalls 2A, 2B, 2C and 2D are formed with a number of reinforcing vertical grooves 9. In use the container body 2 is oriented laterally so as to face toward a wafer transporting robot (not shown) in the semiconductor wafer production line or the like. On the exterior of the sidewall 2A that corresponds to the bottom when arranged laterally, there is provided a positioning unit 11 for the thin-plate holding container 1. On the exterior of the sidewall 2B, that corresponds to the top when arranged laterally, is a detachable top flange 6. The exteriors of the sidewalls 2C and 2D, which correspond to sidewalls when arranged laterally, has detachable handles 7. The carrying handles 7 are not limited to bar-shaped handles and may be other shapes such as a round grip handle and the like.

The aforementioned positioning unit 11 is formed of three fitting grooves 12, i.e., a first fitting groove 12A for alignment with the vertical, and a second and a third fitting grooves 12B and 12C inclined at the same angle (about 60 degrees) with the vertical of the container body 2. These three fitting grooves 12A, 12B and 12C are formed with a high degree of accuracy according to the standard. The thin-plate holding container 1 may be positioned accurately by fitting the respective fitting grooves 12A, 12B and 12C of the positioning unit 11 to fitting projections (not shown) on the mounting base side, so that the semiconductor wafers may be inserted and removed by the wafer transporting robot.

The bottom plate 2E is provided with legs 13. The respective legs 13 are square and extend downward from four corners of the bottom plate 2E. When the container body 2 is vertically oriented, the container body 2 is stably supported by these four legs 13.

Supporting bases 15 for supporting the thin-plate holders 3 to be detachably mounted thereto are provided inside the sidewalls 2C and 2D of the container body 2. Each supporting base 15 includes an upper base portion 15A and a lower base portion 15B. Each supporting base 15 is provided with a supporting projection 16. The supporting projection 16 is fitted to the thin-plate holder 3 to support the holder 3.

Figure 6:
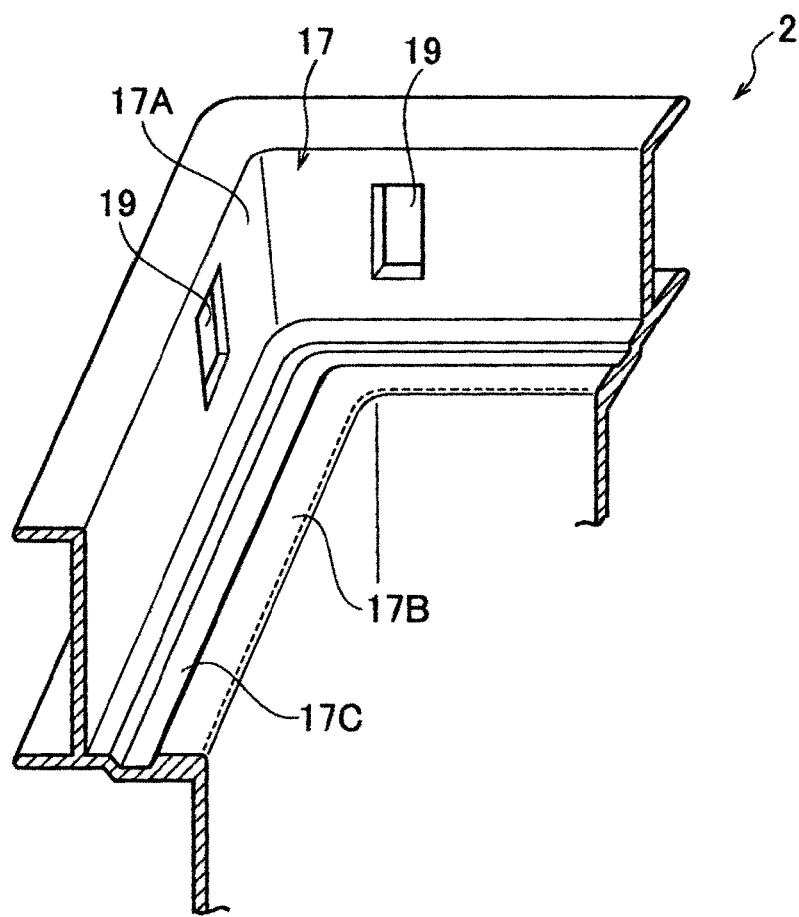
FIG. 6 is a perspective view of a principal portion of a container body of the thin-plate holding container.
Figure 7:
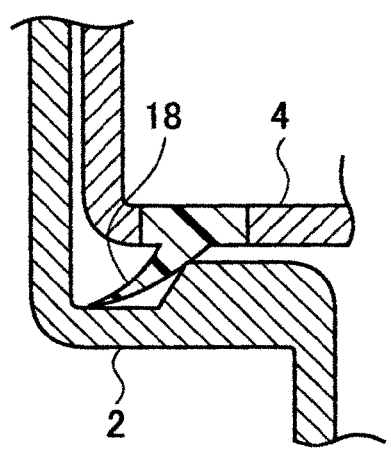
FIG. 7 is a cross-sectional view of a principal portion at the contact between the lid unit for transportation and the container body.

As shown in FIG. 6 and FIG. 7, a lid unit receiving recess 17, in which the lid unit 4 is fitted, is provided at the upper end of the container body 2. The lid unit receiving recess 17 is formed by lateral extension of the upper end of the container body 2 to dimensions corresponding to the dimensions of the lid unit 4. Accordingly, the lid unit 4 is fitted between the vertical plates 17A of the lid unit receiving portion 17, and thus rests on horizontal rim 17B thereof, attached to the lid unit receiving recess 17. The horizontal rim 17B has a seal groove 17C for receiving a gasket 18 mounted around the lower surface of the lid unit 4 to seal the interior of the thin-plate holding container 1. The vertical plate 17A has first recesses 19 which receive lid locking claws 24 of the simplified attaching/detaching mechanism 23 for transportation (FIG. 8) to fix the lid unit 4 to the container body 2. The first recesses 19 are formed as four-sided depressions in the vertical plates.

At the centers of the vertical plates 17A on the sidewalls 2C and 2D, are formed second recesses 21, as shown in FIG. 3, which are used in the production line. The second recesses 21 are adapted to receive the locking plate 34 of the simplified attaching/detaching mechanism 32 of the lid unit 5 and to thereby fix the lid unit 5 to the container body 2. The second recesses 21 have positions, shapes and dimensions as specified in the standard.

Figure 8:
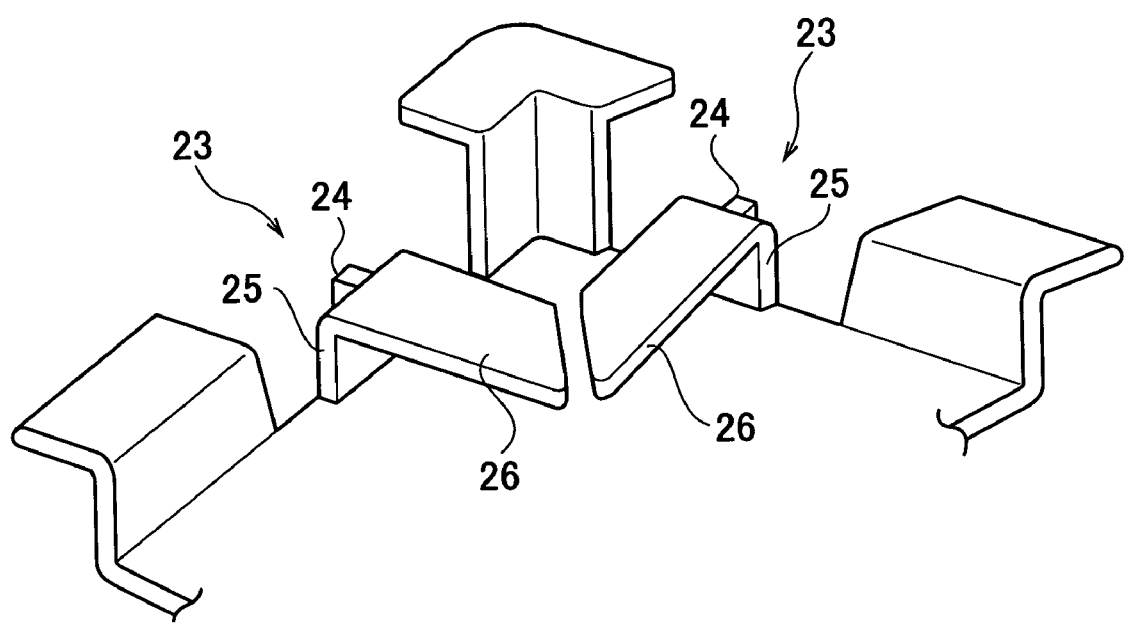
FIG. 8 is a perspective view of a simplified attaching/detaching mechanism on the lid unit for transportation.

The lid unit 4 for transportation is a conventional lid unit, and is constructed as shown in FIGS. 2, 7 and 8. The lid unit 4 for transportation is formed into a dish shape and the central portion thereof is raised into a cylindrical shape so as not to come into contact with the upper portion of the semiconductor wafers accommodated therein. The upper surface of the lid unit 4 is further formed with leg receiving portions 22, to which the legs 13 formed at the bottom of the container body 2 are fitted, at four positions thereof.

The lid unit 4 is provided at its four corners with a simplified attaching/detaching mechanism 23 for detachably fixing the lid unit 4 for transportation to the container body 2. The simplified attaching/detaching mechanism 23 is mainly constructed of a lid unit locking claw 24 which projects from the peripheral edge of the lid unit 4 for transportation, a flexible supporting plate 25 to which the lid unit locking claw 24 is attached, and a releasing plate 26 extending from the supporting plate 25 horizontally for releasing the lid unit locking claw 24 by being pressed by the operator with his/her finger.

The lid unit 5 for the production line is a lid unit that enables the container body 2 of the transported thin-plate holding container 1 to be used in the production line in the plant as is. The lid unit 5 for the production line is stored in the semiconductor manufacturing plant or the like as a single product, independently of the aforementioned thin-plate holding container 1. The lid unit 5 for the production line is constructed as shown in FIG. 1 and FIGS. 9 to 11.

The lid unit 5 for the production line is generally formed into a four-sided shallow dish shape as a whole, so that it does not overhang outward when attached to the lid unit receiving recesses 17 of the container body 2. The lid unit 5 for the production line is provided with a gasket receiving groove 31 attached around the lower portion thereof. The gasket receiving groove 31 is provided with a gasket (not shown), and seals the interior of the container body 2 by fitting into the seal groove 17C (FIG. 6) when the lid unit 5 for the production line is attached to the lid unit receiving recess 17. The gasket is formed as appropriate, corresponding to the shape of the seal groove 17C. Since the seal groove 17C may not be formed into the shape of a simple groove, the gasket should be formed into a shape corresponding to the shape of the groove.

On the upper surface of the lid unit 5, at the centers of the edges of the sides thereof, are provided simplified attaching/detaching mechanisms 32 for the production line for detachably fixing the lid unit 5 to the container body 2. The positions of the simplified attaching/detaching mechanism 32 for the production line are set according to the standard. The attaching/detaching mechanism 32 includes a body recess 33, a locking plate 34, drive-out member 35 and a cover 36.

Figure 9:
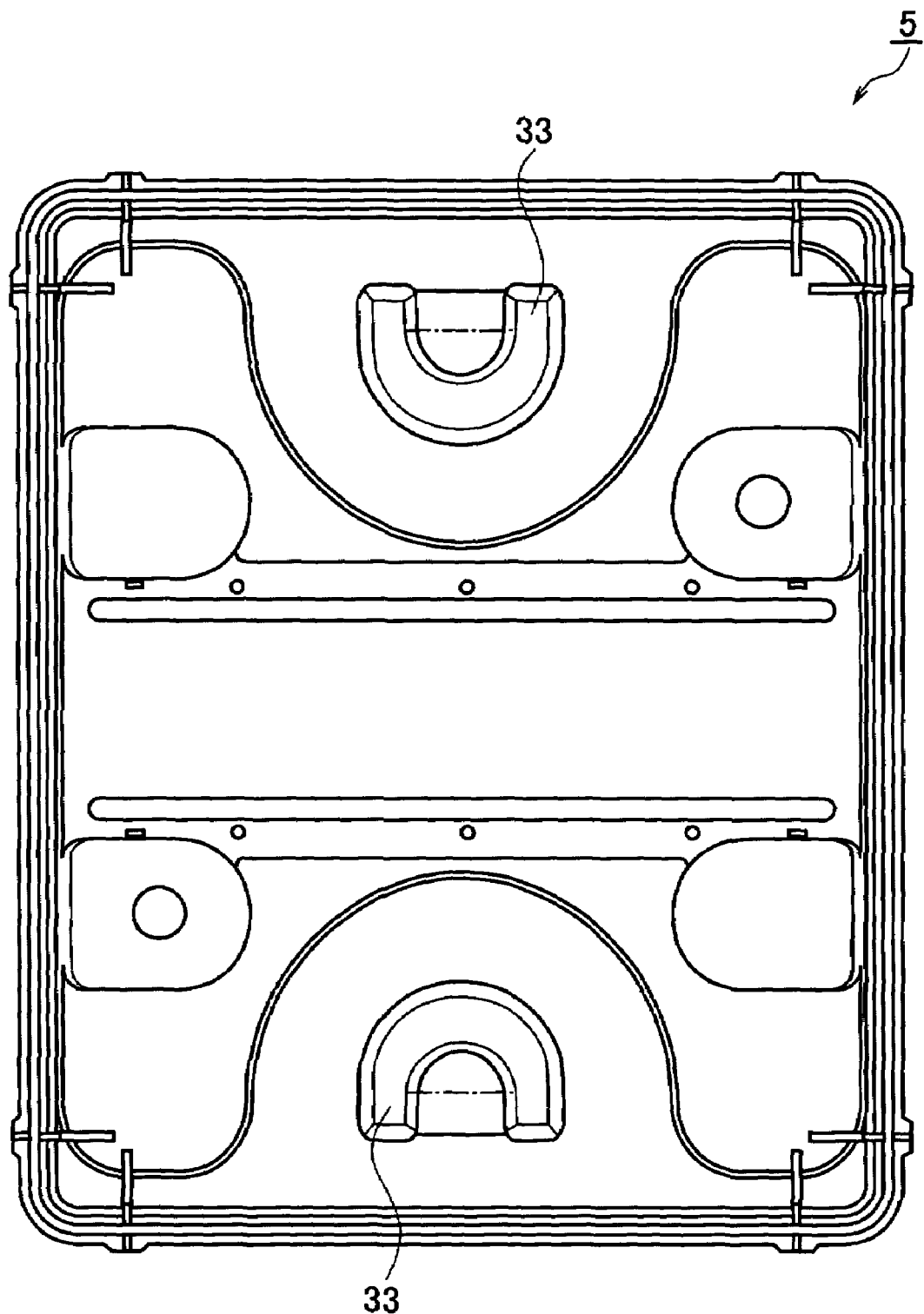
FIG. 9 is a planar view of a backside of a lid unit for the production line.
Figure 10:
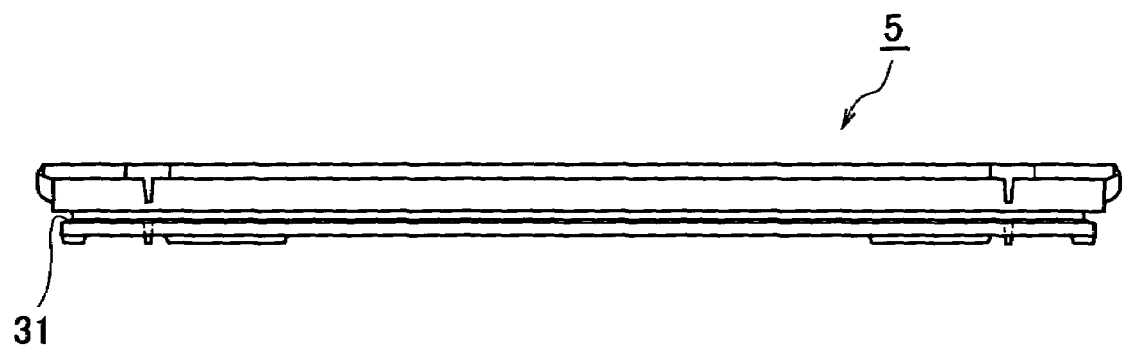
FIG. 10 is a front side view of the lid unit for the production line.
Figure 11:
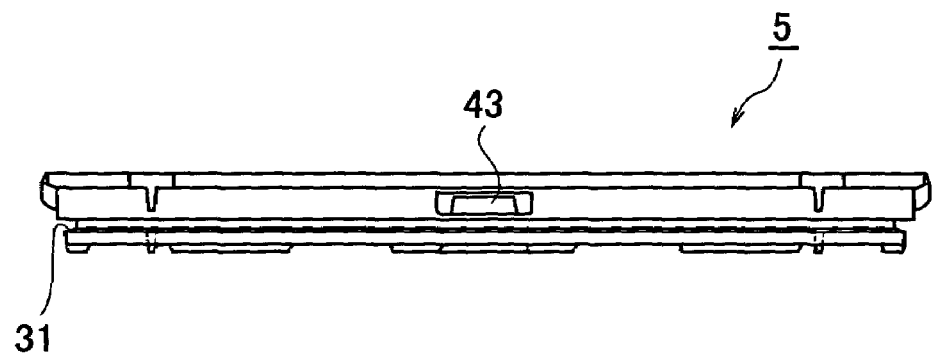
FIG. 11 is a side view of a lid unit for the production line.
Figure 12:
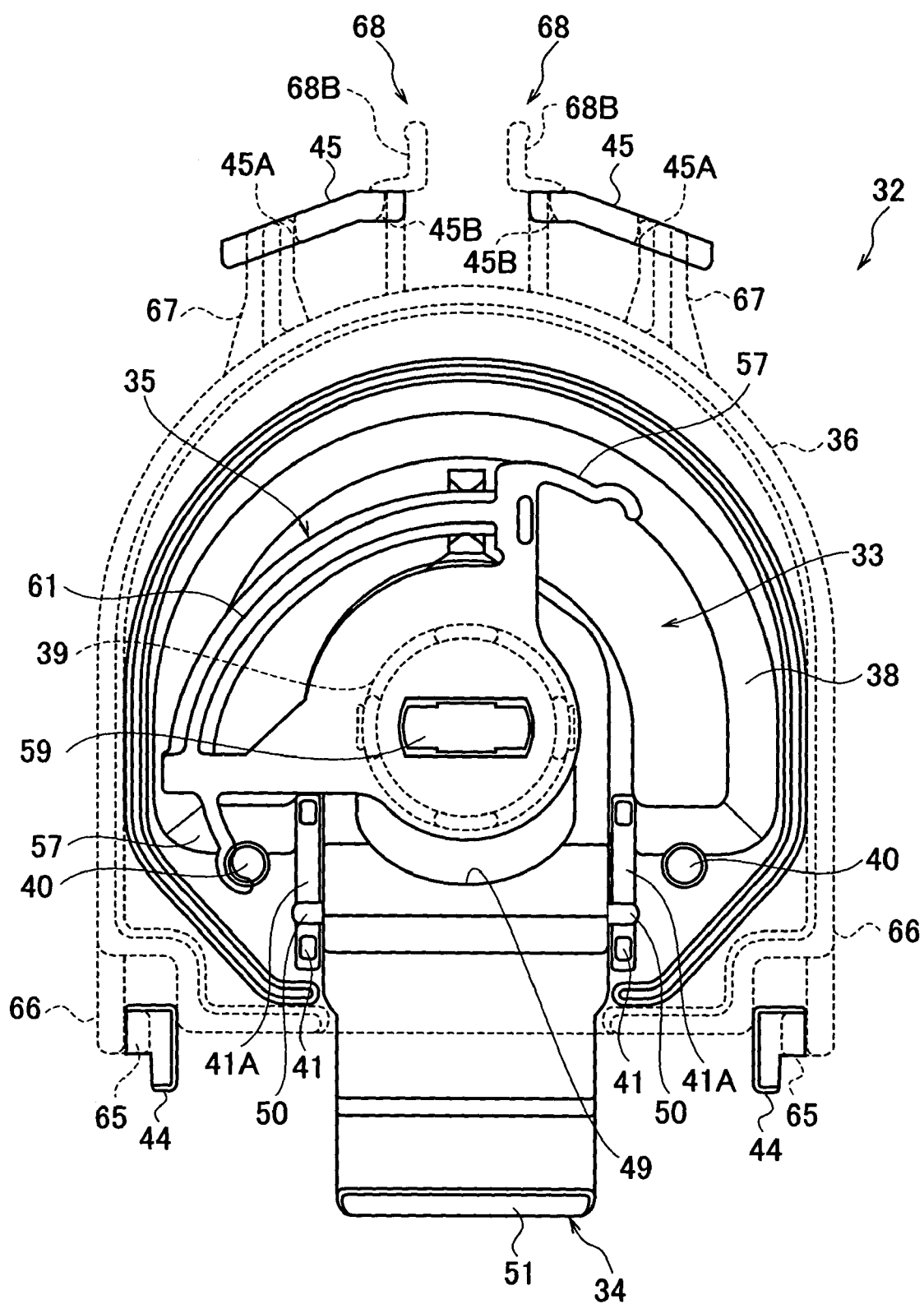
FIG. 12 is a plan view of a simplified attaching/detaching mechanism for the production line.
Figure 13:
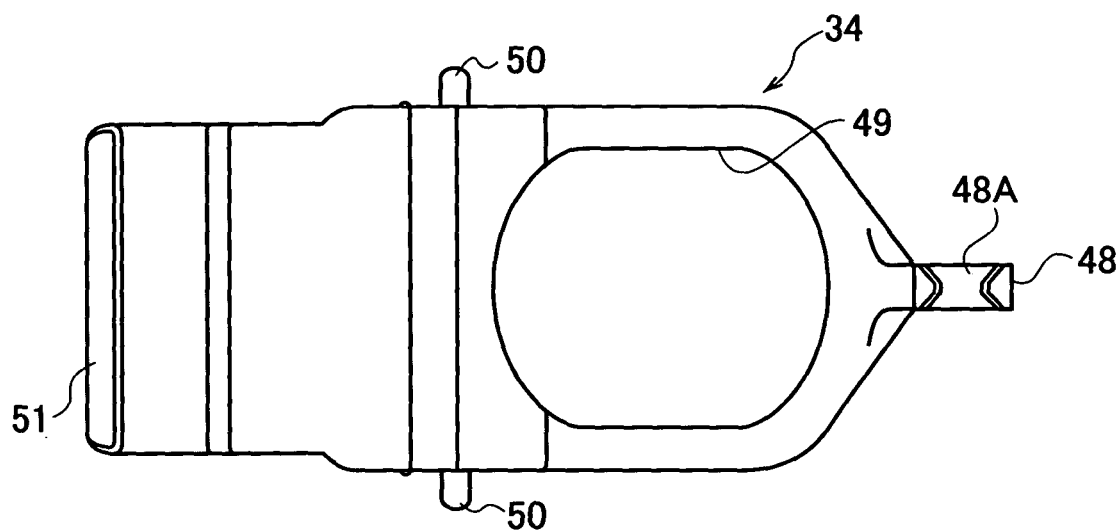
FIG. 13 is a plan view of a locking plate.
Figure 14:
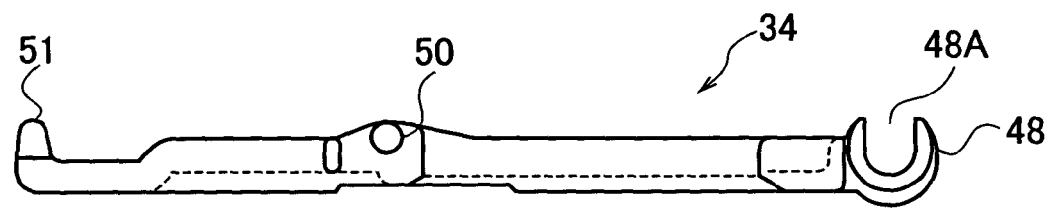
FIG. 14 is a front view of the locking plate of FIG. 13.
Figure 15:
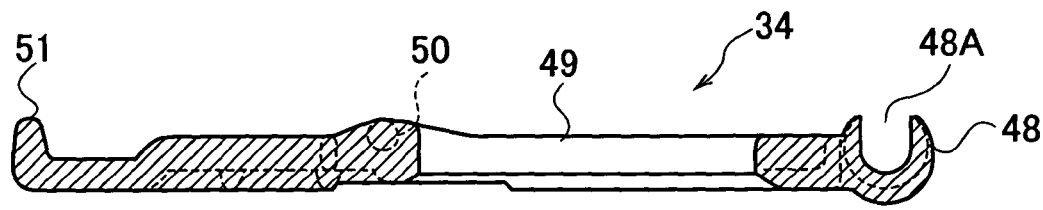
FIG. 15 is a cross-sectional view of the locking plate of FIG. 13.
Figure 16:
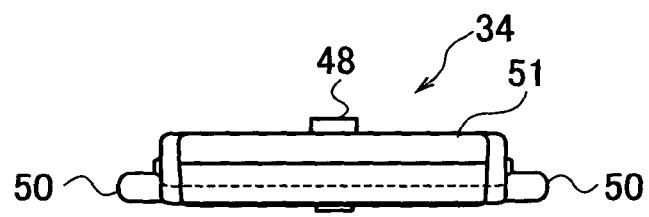
FIG. 16 is a side view of the locking plate of FIG. 13.

The body recesses 33 on the lid unit 5 are shown in FIGS. 1, 9 and 12. The body recess 33 includes an operating groove 38, a supporting cylinder 39, a locking pin 40, a supporting plate 41, an entrance 42, and entrance hole (slot aperture) 43, a locking shaft bearing 44, and supporting plate 45.

The operating groove 38 accommodates the drive-out member 35, allowing it to rotate in operation. The operating groove 38 is shaped as an elongated groove curved into a semi-circular shape.

The supporting cylinder 39 rotatably supports the drive-out member 35 and the rising and setting movement of the locking plate 34. The supporting cylinder 39 is disposed at the center of the semi-circular operating groove 38.

The locking pin 40 is for securing the drive-out member 35 at a preset angle. The locking pin 40 fixes the drive-out member 35 at a preset angle when engaged by the locking arm 57, which will be described later, of the drive-out member 35.

The supporting plate 41 supports the rising and setting movement of the locking plate 34. Two supporting plates 41 are disposed spaced from each other by a distance corresponding to the width of the locking plate 34 so as to accommodate the locking plate 34 therebetween. The upper end portion of the supporting plate 41 is provided with a pin supporting recess 41A for pivotally supporting pin 50 on the locking plate 34. The pin supporting recess 41A has a length that allows back and forth movement of pivot pins 50 occurring in association with the rising and setting movement of the locking plate 34. These two supporting plates 41 define the entrance groove 42. The rising and setting movement of the locking plate 34 is guided and supported by the entrance groove 42. The entrance hole 43 is formed adjacent the tip ends of the entrance groove 42. The locking plate 34 is adapted to project through and outward from the entrance hole 43 to engage within second recess 21 of the container body 2 and thereby fix the lid portion 5 to the container body 2.

The aforementioned operating groove 38 is formed in a single piece of the lid unit 5 without penetrating either the front surface or the back surface of the lid unit 5. In addition, the respective portions are formed with a gentle slope as a whole so that good water drainage is achieved.

Figure 22:
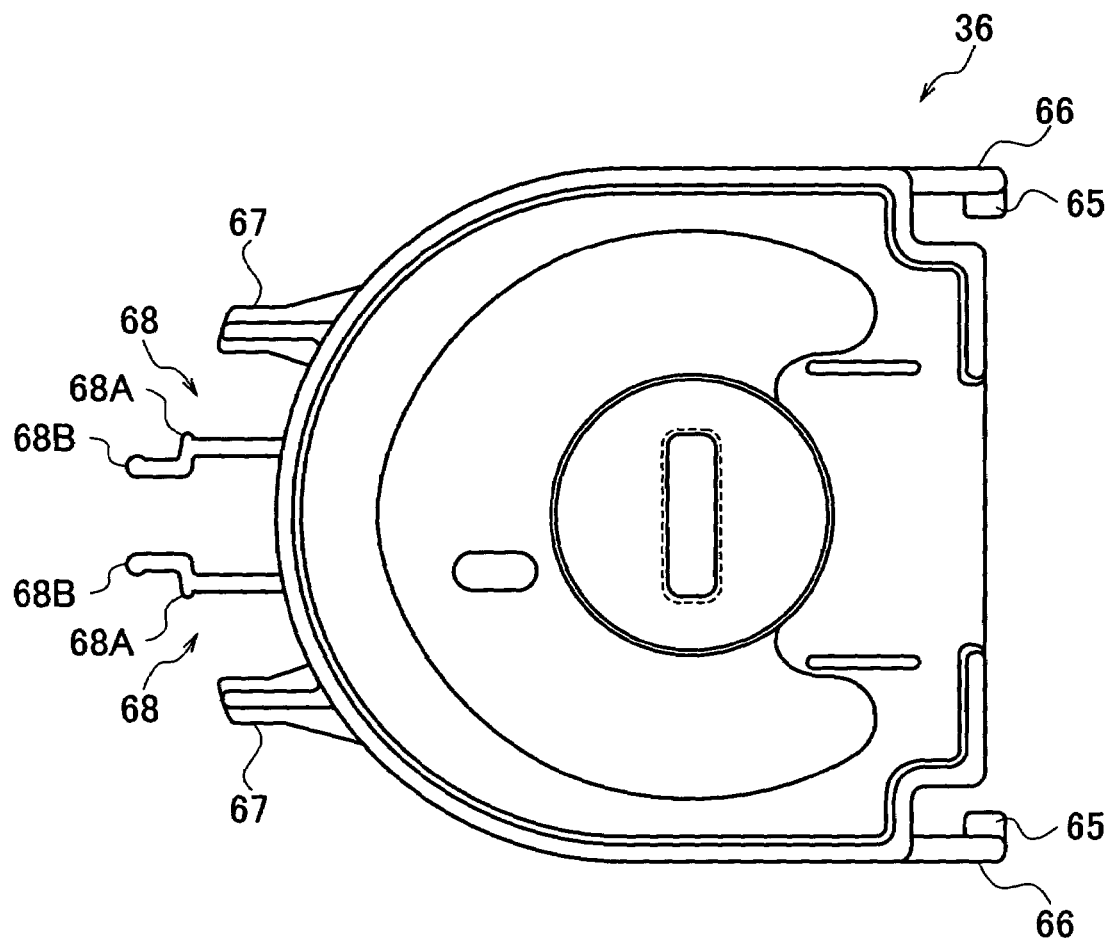
FIG. 22 is a plan view of a cover.
Figure 23:
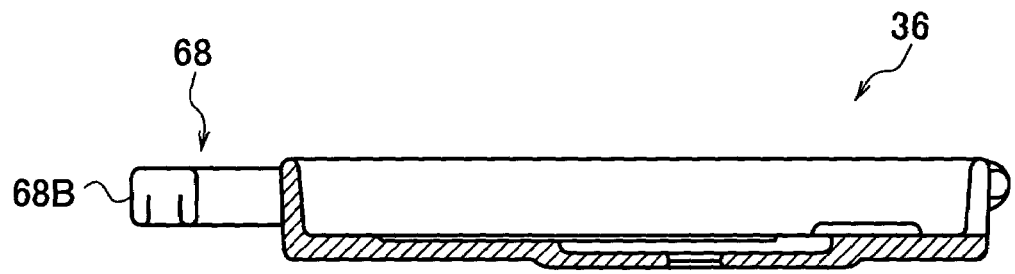
FIG. 23 is a cross-sectional view of the principal operating portion of the simplified attaching/detaching mechanism for the production line.

The locking shaft bearing 44 pivotally supports one end of the cover (FIGS. 22 and 23). Two locking shaft bearings 44 are located on both sides of the base of the cover 36 to receive respective locking shafts 65 of the cover 36, thereby attaching the cover 35. The locking shaft bearing 44 is formed by an outwardly opening notch, for receiving the shaft 65 of the cover 36.

The supporting plates 45 serve as a rest for supporting the free end of the cover 36. Each supporting plate 45 includes a locking hole 45A which receives a locking rod 67, which will be described later, of the cover 36, and an engaged portion 45B which is engaged by an engaging strip 68A of the retaining rod 68, which will be described later.

The locking plate 34 is a member which serves to fix the lid unit 5 to the container body 2. The locking plate 34, as shown in FIGS. 12 to 16, includes an engaging hook (rail follower) 48, a guide hole 49, pivot pins 50, and a holding claw 51.

Figure 17:
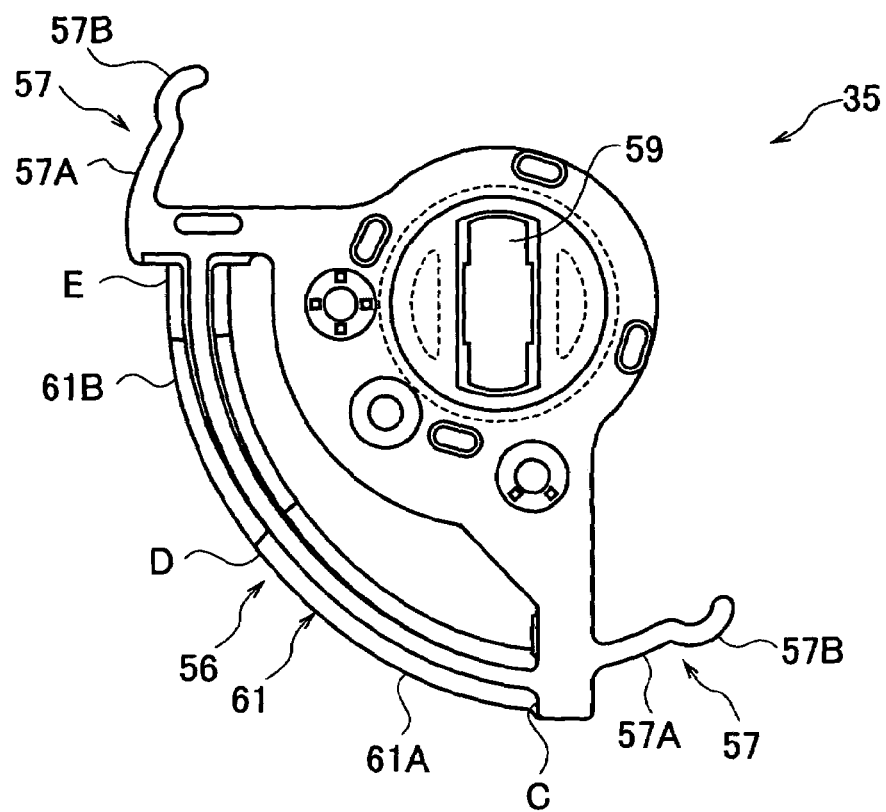
FIG. 17 is a plan view of a drive-out member.
Figure 18:
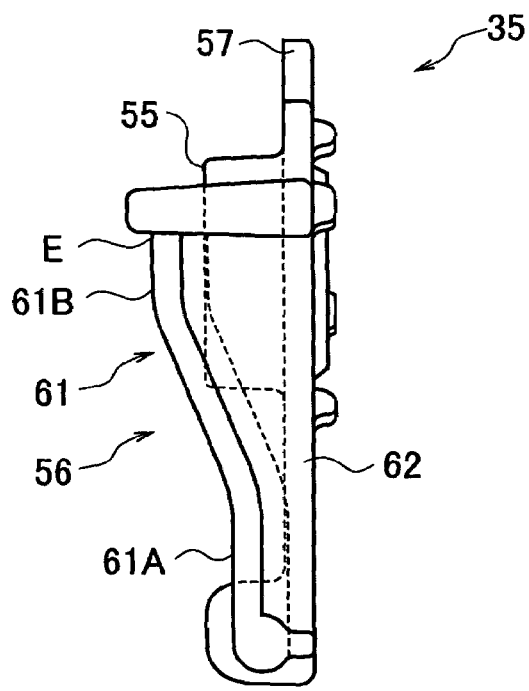
FIG. 18 is a side view of the drive-out member.
Figure 19:
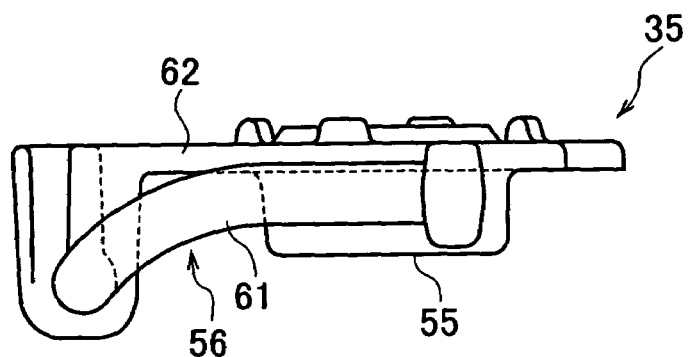
FIG. 19 is a front view of the drive-out member.
Figure 20:
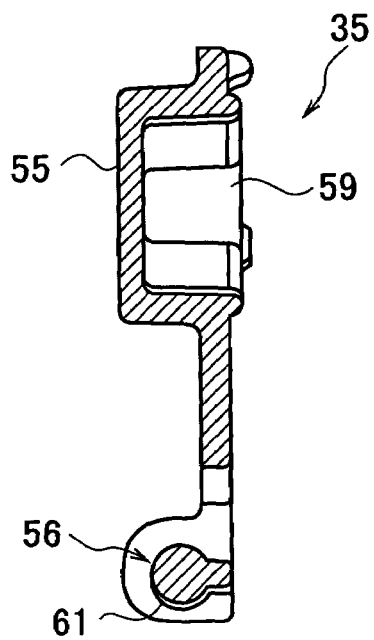
FIG. 20 is a cross-sectional side view of the drive-out member.
Figure 21:
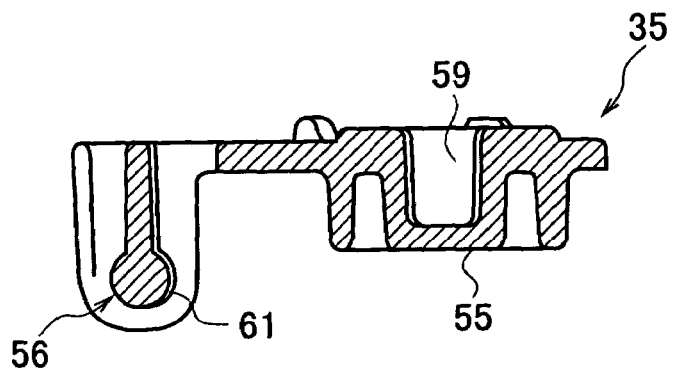
FIG. 21 is a cross-sectional front view of the drive-out member.

The engaging hook 48 is formed into a C-shape, and fitted to and interconnected with a rail 56 (FIG. 17) which will be described later, of the drive-out member 35. The engaging hook 48 has an opening 48A which is slightly smaller than the inner diameter thereof, and is slidably fitted on the rail 56 having a substantially circular cross section.

The guide hole 49 guides the rising and setting movement of the locking plate 34, and is formed with a substantially oval shape at the center of the locking plate 34. The guide hole 49 is fitted over the supporting cylinder 39.

Pivot pins 50 are provided on the locking plate 34 so as to project laterally therefrom, and are supported within the pin supporting recesses 41A of the aforementioned supporting plates 41.

The pivot pins 50 support the pivotal movement and the rising and setting movement of the locking plate 34.

The holding claw 51 serves to fix the lid unit 5 to the container body 2 by fitting within a second recess 21 of the container body 2 when driven to its extended position by the drive-out member 35. The holding claw 51 is formed by bending the distal end portion thereof upward so that the upper end portion thereof comes into pressing contact with the upper surface of the aforementioned second recess 21 (the state shown in FIG. 25) to press the lid unit 5 toward the container body 2.

The drive-out member 35 drives the locking plate 34 out and pivots it upward and downward to fix the lid unit 5 to the container body 2. The drive-out member 35 includes a supporting post 55, a supporting rail 56, and a locking arm 57 as shown in FIG. 12 and FIGS. 17 to 21.

The supporting column 55 supports rotation of the drive-out member 35. The supporting post 55 is rotatably fitted on the supporting cylinder 39. A key groove 59 is formed on the upper surface of the supporting post 55. The key groove 59 is formed as a substantially rectangular hole, for receiving a T-shaped release key (not shown) in the plant. The release key is standardized and the key groove 59 is formed correspondingly.

The supporting rail 56 is engaged by the engaging hook 48 of the locking plate 34 for raising and extending the locking plate 34, i.e, for guiding locking/unlocking movement. The supporting rail 56 extends through an angle of about 90 degrees centered on the supporting post 55 (FIG. 18) and includes a circular rod 61, fitted into the engaging hook 48, and a supporting plate 62 formed integrally with the circular rod 61. The circular rod 61 has a radius and a height which change relative to those of the supporting post 55. More specifically, the circular rod 61 is constructed of a driving portion 61A and a raising portion 61B bordering at the central portion D thereof. The driving portion 61A is formed in such a manner that the radial distance from the supporting post 55 decreases gradually from the end position C (FIG. 17) toward the central position D, so that the locking plate 34 is driven outward as the engaging hook 48 is moved from position C toward the central position D and is retracted as the engaging hook 48 is moved back toward C. The raising portion 61B of the circular rod 61 curves upward from D toward the end E, relative to the base of supporting post 55, while the radial distance from the supporting post 55 remains almost constant. More specifically, when the engaging hook 48 is positioned at position D on the circular rod 61, the holding claw 51 at the distal end of the locking plate 34 is in its lowered state, and when the engaging hook 48 is positioned at E, the engaging hook 48 is pressed downward to raise the holding claw 51 upward (the state shown in FIG. 25). Accordingly, when the engaging hook 48 is moved from the end C of the circular rod 61 to the central position D, the locking plate 34 is extended outward through the entrance hole 43, and when it is moved from the central position D to the end E, the thus extended holding claw 51 of the locking plate 34 is moved upward and brought into contact with the upper interior surface of a second recess 21 of the container body 2 so that the lid unit 5 is fixed to the container body 2.

The locking arms 57 serve to fix the drive-out member 35 in positions at the ends of its clockwise and counterclockwise rotation. The locking arms 57 each include a resilient arm portion 57A extending outward from the left and right ends of the supporting rail 56, respectively, and an arcuate locking claw 57B formed at the distal end of the arm portion 57A for engaging a locking pin (stationary element) 40.

The cover 36 covers both the locking plate 34 and the drive-out member 35. The cover 36 is formed into a substantially semi-circular dish shape and is provided with locking shafts 65 which extend inwardly from ends of the supporting plates 66, and which are fitted in the locking shaft bearings 44 to fix the proximal end of the cover 35 to the body recess 33. Two locking rods 67 are provided at the distal end of the cover 36 to fix the distal end of the cover 36 to the body of the lid unit 5 by being seated within the engaging hole 45A on the supporting plate 45. The locking shafts 65 and the locking rods 67 are adapted to be fitted within the locking shaft bearings 44 and the supporting plates 45, respectively by moving the cover 36 inwardly (toward the supporting plate 45). The flexible retaining rods 68 are provided between the two locking rods 67 and include engaging portions 68A for engagement between portions 45B of the supporting plates 45 and finger strips 68B to be manually pinched together for releasing the engaging portions 68A from the portions 45B of the supporting plates 45.

The lid unit 5 is provided with a wafer holding bracket 71 for supporting semiconductor wafers accommodated in the container body 2 as shown in FIG. 1. The wafer holding bracket 71 includes a strip of V-shaped holding elements 72 for supporting the semiconductor wafers by direct contact with the peripheral edges thereof and supporting arms 73 for resiliently supporting the V-shaped holding elements 72.

The thin-plate holding container 1 thus constructed is used in the following manner.

The thin-plate holding container 1, in which the semiconductor wafers or the like are stored is transported to the destination plant or the like, with the lid unit 4 for transportation attached. The lid unit locking claws 24 of the simplified attaching/detaching mechanisms 23 of the lid unit 4 are fitted within the first recesses 19 of the lid unit receiving portion 17 and thus the lid unit 4 for transportation is attached to the container body 2. Accordingly, the interior of the container body 2 is completely sealed while being transferred to the destination plant or the like.

After it has arrived at the plant or the like, an operator presses the release strips 26 of the simplified attaching/detaching mechanisms 23 of the lid unit 4 for transportation downward with his/her finer to disengage the lid unit locking claws 24 from the first recesses 19, then removes the transportation lid unit 4 from the container body 2, and then feeds the semiconductor wafers or the like stored therein to the line in the plant or the like.

Figure 24:
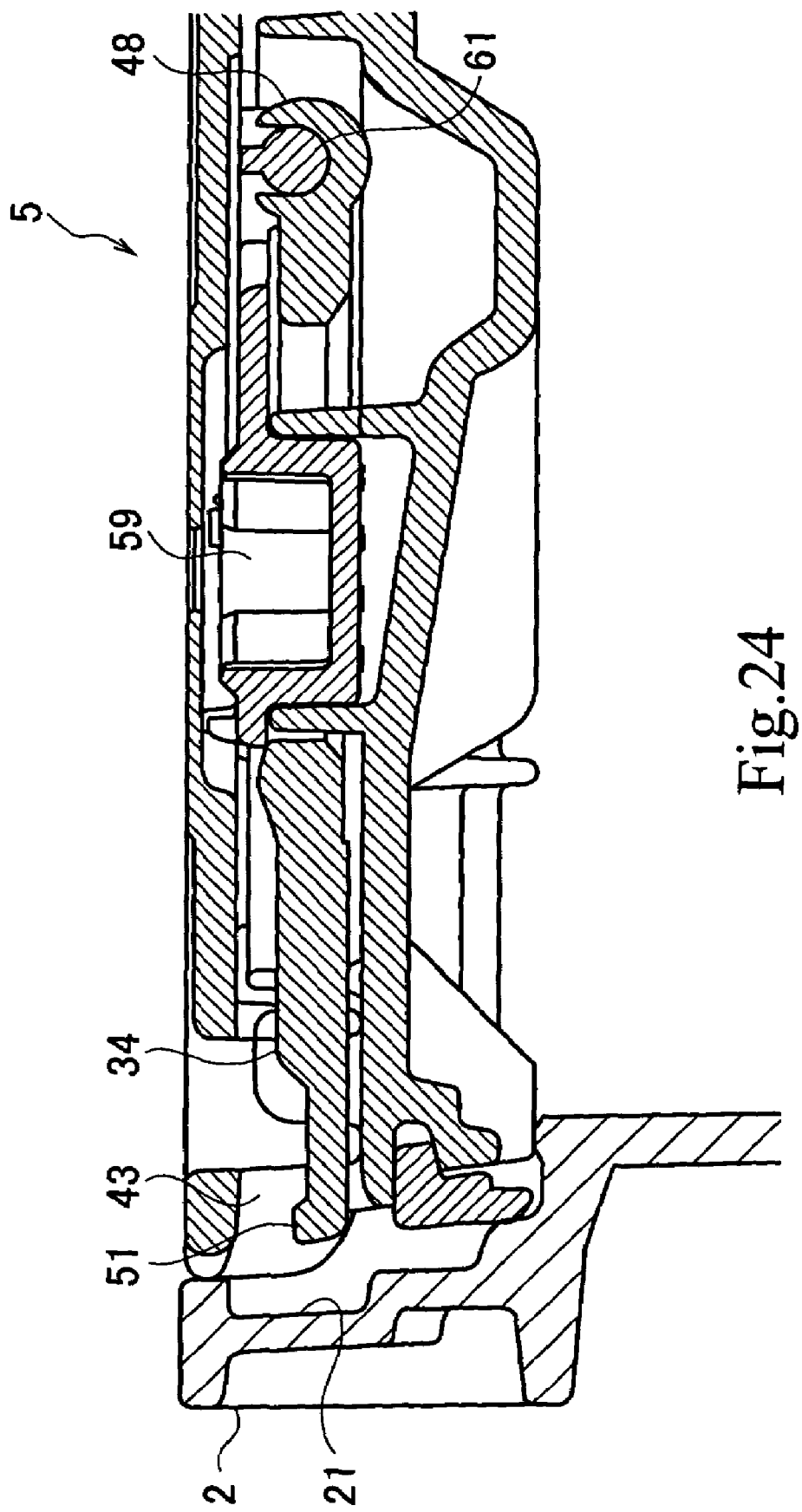
FIG. 24 is a cross-sectional view of the principal operating portion of the simplified attaching/detaching mechanism for the production line.
Figure 25:
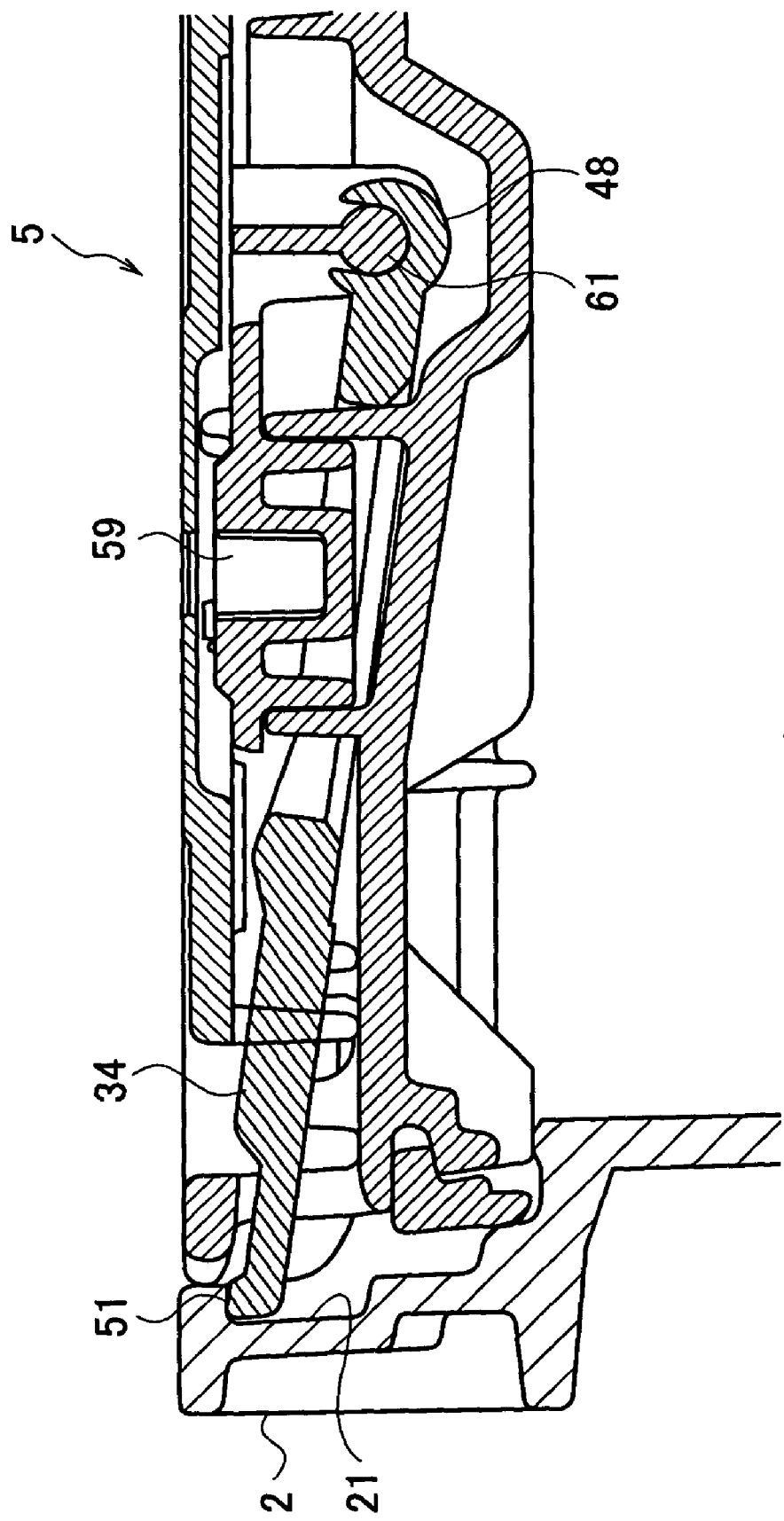
FIG. 25 is a cross-sectional view of principal operation portion of the simplified attaching/detaching mechanism for the production line.

The thin-plate holding container 1 is reused. In the destination plant or the like, to the container body 2 is attached the production line lid unit 5 prepared in advance after washing. In other words, the lid unit 5 is attached to the lid unit receiving portion 17 of the container body 2, and the release key is inserted and turned in the key groove 59. Accordingly, the drive-out member 35 is turned, and thus the locking plate 34 engaged with the supporting rail 56 via the engaging hook 48, is driven to its extended/locking position by the driving-out portion 61A, wherein it projects through the entrance hole 43 and is thus seated within a second recess 21. Thus, from the state shown in FIG. 24, the engaging hook 48 is pushed downward by the raising portion 61B, and the holding claw 51 is moved upward about the pivotal movement supporting pin 50, as shown in FIG. 25, so as to be brought into contact with and pressed toward the upper interior surface of the second recess 21. Consequently, the supporting plate 41 is pushed downward by the pivotal movement supporting pin 50, and thus the lid unit 5 for the production line is fixed to the container body 2.

In order to dismount the lid unit 5 from the container body 2, the operator inserts the release key into the key groove 59 and rotates it in the direction opposite from the direction in the case described above. Accordingly, the drive-out member 35 is turned in the opposite direction, and the engaging hook 48 moves along the supporting rail 56 in the opposite direction from the case above. In other words, the engaging hook 48 is pulled up and the holding claw 51 moves downward and thus is retracted into the cover 36. As a consequence, the lid unit 5 is released, and thus the operator dismounts it from the container body 2. In this manner, the container body 2 is reused for transportation, for the production line in the plant or the like.

Although the semiconductor wafer is taken as an example in the embodiment described above, the same advantages and effects as in the above-described embodiment may be expected also in the case where other types of thin-plates, such as the memory disks or liquid crystal glass substrates are used.

As described in detail above, according to the thin-plate holding container of the invention, the following effects are achieved.

(1) Since the production line lid unit 5 is interchangeable with the transport lid unit 4, the container body 2 can be used for transportation, as well as in the production line.

As a consequence, efficiency of usage is improved, waste of resources is prevented, and generation of waste products is prevented.

(2) Since the simplified attaching/detaching mechanism 32 is provided on the lid unit 5, the lid unit 5 may be attached to the container body 2 prepared for transportation via the simplified attaching/detaching mechanism 32 and thus the container body 2 used for transportation may be used for the production line as is.

(3) Since the simplified attaching/detaching mechanism 32 includes the locking plate 34, to be engaged within second fitted recess 21 of the container body 2, and the drive-out member 35 raises and extends the locking plate 34, the lid unit 5 may easily be attached to and detached from the container body 2.

(4) since the locking arm 57 is provided at the end of the drive-out member 35 in the direction of rotation, the drive-out member 35 may be reliably fixed at predetermined positions at the limits of its rotation.

(5) Since the supporting rail 56 for raising and extending the locking plate 34 is provided on the drive-out member 35, raising, lowering, extending and retracting movements of the locking plate 34 are controlled by the supporting rail 56, and thus the lid unit 5 may be reliably fixed in place or released.

(6) Since the locking plate 34 is supported for both pivotal and sliding movement, the lid unit 5 may be reliably fixed to the container body 2 by sliding the locking plate 34 into the container body 2, and then pivoting it into contact with the container body 2.

(7) Since the locking plate 34 is provided with a holding claw 51, for engaging the container body 2, at the distal end thereof, the lid unit 5 may be pressed toward and reliably fixed to the container body 2 by engaging the holding claw 51 within the second recess 21 of the container body 2.

(8) Since the lid unit 5 may be used as a lid unit for the thin-plate holding container 1, the thin-plate holding container 1 may also be used for the production line in the plant or the like after having been used for transportation.

As described above, the thin-plate holding container 1 according to the present invention is useful as a carrier for transporting semiconductor wafers, hard memory disks (magnet disks) and substrates of compact disks (CD), which must be absolutely protected from dust and the like. In addition, it is also useful as a carrier for transporting these products in a production.

The invention claimed is:

1. A lid unit for closing an opening of a container body for transport of thin plates housed therein, said lid unit having a four-sided shape and comprising:
   a pair of attaching/detaching mechanisms respectively located at the center of each of opposing sides of the lid unit, each of said attaching/detaching mechanisms comprising:
   a locking plate mounted for sliding and pivoting movements relative to a body portion of the lid unit;
   a drive-out member, mounted for rotation relative to said body portion about a central axis, for driving said locking plate, with sliding and pivoting movement, to an extended position for locking the lid unit to the container body and for retracting said locking plate, with sliding and pivoting movement, to a retracted position at which the lid unit is unlocked from the container body; and
   a locking arm integral with and extending from said drive out member in the direction of rotation in one direction, said locking arm, having an indentation for receiving therein one stationary element extending from said body portion, thereby fixing the drive member against rotation.

2. A lid unit for thin-plate holding container according to claim 1 wherein said drive-out member is engaged with a supporting rail for controlling the sliding and pivoting movements of the locking plate.

3. A lid unit for a thin-plate holding container according to claim 1 wherein said locking plate comprises a holding claw at a distal end thereof for engaging the container body.

4. A thin-plate holding container comprising a container body for transporting a plurality of thin-plates accommodated therein and the lid unit of claim 1.

5. A lid unit according to claim 1 wherein said drive-out member is in the shape of a sector and includes a central portion with rotation leading edge surfaces extending from said central portion to an outer periphery of said drive-out member and defining a predetermined angle therebetween, wherein said locking arm extends, in one rotational direction, from one of the rotation leading edge surfaces.

6. A lid unit according to claim 5 wherein said locking arm comprises an engaging element with the indentation and a resilient arm portion connecting the engaging element to said one rotation leading edge surface.

7. A lid unit according to claim 6 wherein the angle is approximately 90°.

8. A lid unit according to claim 5 further comprises a second locking arm extending, in a second rotational direction, opposite the one rotation direction, from a second of the rotation leading edge surfaces, said second locking arm having an indentation for receiving therein a second stationary element extending from said body portion, thereby fixing the drive-out member against rotation.

9. A lid unit according to claim 8 wherein said second locking arm comprises a second engaging element with an indention and a resilient arm portion connecting the second engaging element to said second rotation leading edge surface.

10. A lid unit according to claim 1 wherein said drive-out member is in the shape of a sector and includes a central portion and radial arms with rotation leading edge surfaces extending from said central portion to an outer periphery of said drive-out member and defining a predetermined angle therebetween, wherein said locking arm extends, in one rotational direction, from one of the rotation leading edge surfaces, the lid unit further comprising:
   a rail integral with and extending between said radial arms of said drive-out member;
   a latching element, extending from said locking plate, for engaging the container in the extended position; and
   a rail follower integral with and extending from a side of said locking plate opposite said latching element, said rail follower having an opening in which said rail is seated, whereby said rail follower slidably engages and grips said rail, whereby said rail guides the sliding and pivoting movements of said locking plate.

11. A lid unit according to claim 10 wherein said rail includes:
   a first portion spaced from said central axis by a distance which changes over the length of the first portion for driving the sliding movement of said locking plate; and
   a second portion spaced from a surface of said body portion by a distance which changes over the length of the second portion for driving the pivoting movement of said locking plate.

12. A lid unit for closing an opening of a container body for transport of thin plates housed therein, said lid unit comprising:

a pair of attaching/detaching mechanisms respectively located at the center of each of opposing sides of the lid unit, each of said attaching/detaching mechanisms comprising:
- a locking plate mounted for sliding and pivoting movements relative to a body portion of the lid unit, said locking plate including a latching element for engaging the container body;
- a drive-out member, mounted for rotation relative to said body portion about a central axis, for driving said locking plate, with sliding and pivoting movement, to an extended position, where the locking element engages the container body to lock the lid unit to the container body, and for retracting said locking plate, with sliding and pivoting movement, to a retracted position at which the lid unit is unlocked from the container body, said drive-out member comprising a central portion mounted on said central axis and arms extending outwardly from said central portion;
- a rail integral with and extending between said arms of said drive-out member; and
- a rail follower integral with and extending from a side of said locking plate opposite said latching element, said rail follower having an opening in which said rail is seated, whereby said rail follower slidably engages and grips said rail for guiding the sliding and pivoting movements of said locking plate.

13. A lid unit according to claim 12 wherein said rail includes:
   - a first portion spaced from said central axis by a distance which changes over the length of the first portion for driving the sliding movement of said locking plate; and
   - a second portion spaced from a surface of said body portion by a distance which changes over the length of the second portion for driving the pivoting movement of said locking plate.

* * * * *